United States Patent [19]
Schmidt

[11] Patent Number: 5,694,082
[45] Date of Patent: Dec. 2, 1997

[54] CIRCUIT ARRANGEMENT FOR DETERMINING INTERMODULATION PRODUCTS

[75] Inventor: Karl-Heinz Schmidt, Möttingen-Balgheim, Germany

[73] Assignee: Mikom GmbH, Buchdorf, Germany

[21] Appl. No.: 604,391

[22] Filed: Feb. 21, 1996

[30] Foreign Application Priority Data

Feb. 22, 1995 [DE] Germany ......................... 195 06 051.2

[51] Int. Cl.[6] ............................................. H03G 5/16
[52] U.S. Cl. ................................... 330/132; 330/284
[58] Field of Search ............................ 330/129, 132, 330/136, 140, 149, 284

[56] References Cited

U.S. PATENT DOCUMENTS

| | | | |
|---|---|---|---|
| 3,781,703 | 12/1973 | Duty | 330/132 X |
| 4,048,573 | 9/1977 | Evans et al. | 330/136 X |
| 4,746,876 | 5/1988 | Sibiga | 330/284 |

Primary Examiner—Steven Mottola
Attorney, Agent, or Firm—Antonelli, Terry, Stout & Kraus, LLP.

[57] ABSTRACT

In an amplifier, which amplifies high-frequency communication signals, there develops odd-order intermodulation products which, because of the identical frequency spacing of the channels, fall into directly adjacent useful channels. In order to keep these intermodulation products below an admissible level, the input of the main amplifier is preceded by an attenuator of adjustable attenuation. The output of the main amplifier is connected to the input of an auxiliary amplifier which has a broader pass band than the main amplifier and amplifies also second-order intermodulation products. The auxiliary amplifier is followed by a low-pass filter which allows those intermodulation products to pass but shuts off other frequency ranges. The second-order intermodulation products which were allowed to pass are rectified in a detector and are amplified in a control circuit the output of which determines the attenuation of the attenuator. The signals which were input into the main amplifier are in this way attenuated to an extent such that the second-order intermodulation products are below the admissible level.

17 Claims, 3 Drawing Sheets

5,694,082

1
CIRCUIT ARRANGEMENT FOR DETERMINING INTERMODULATION PRODUCTS

FIELD OF THE INVENTION

This invention relates to a circuit arrangement for determining intermodulation products of a signal, generated in an amplifier.

BACKGROUND OF THE INVENTION

The characteristic curve of an amplifier deviates from an ideal linear characteristic. Thus in addition to the signal to be amplified there are generated undesired products which, in the presence of only one useful signal, manifest themselves as harmonic distortion products and, in the presence of a plurality of useful signals of different frequencies, as additional intermodulation products.

An amplifier which, for example, is to amplify high-frequency communication signals generated, for example, in mobile radio systems, generates, inter alia, intermodulation products of odd order which, owing to the uniform frequency spacing of the channels, appear directly in adjacent useful-signal channels. Therefore, the amplitudes of those undesired intermodulation products should be kept below a predetermined threshold.

Patent Publication WO 92/12571 describes an amplifier with a circuit comprising a main amplifier, an adjustable attenuator arranged in the signal line of the main amplifier, a regulating control circuit generating a correcting variable defining the attenuation by the attenuator, and a filter preceding the regulating control circuit, wherein input signals of different frequencies are applied to the main amplifier. The main amplifier generates undesired intermodulation products in addition to the amplified input signals. The filter allows intermodulation products to pass, and the intermodulation products passed through the filter determine the correcting variable by which the amplitude of the intermodulation products generated by the main amplifier is kept under a limit value by attenuating the input signals.

In that circuit, in general, different frequencies are applied to an adjustable attenuator and are thereafter input into a main amplifier. The output signals of the main amplifier are picked up by a circuit arrangement in the form of a linearity-monitoring circuit generating a correcting variable which modifies the attenuation of the attenuator. The monitoring circuit analyses the amplitude of the intermodulation products appearing at the output of the main amplifier. The intermodulation product of maximum amplitude is compared with a preset threshold value. If the threshold value is exceeded, there results an excursion of the regulation which determines the correcting value and, hence, the degree of input signal attenuation. The intermodulation products in the output of the main amplifier are in this way kept below a preset limit. The input signals are also applied to the linearity-monitoring circuit so that the same can distinguish the useful signals from the intermodulation products.

This circuit arrangement, however, has a complicated structure and is therefore relatively expensive.

SUMMARY OF THE INVENTION

The present invention provides a circuit arrangement of the above-specified type in a low-cost form.

In accordance with the present invention, a circuit arrangement is comprised of a main amplifier, input apparatus for receiving input signals of different frequencies and

2 applying the input signals to an input of the main amplifier, output apparatus for receiving output signals from an output of the main amplifier, apparatus for attenuating signals passing between the input and output apparatus, a control circuit for generating a correcting variable and for applying the correcting variable to the attenuating apparatus, a first filter for passing a first filtered signal to an input of the control circuit for controlling a value of the correcting variable, and an auxiliary amplifier connected to receive signals derived from the input signal and having an output connected to the input of the first filter for generating the intermodulation products having frequencies higher than a pass band of the main amplifier, at least one of the intermodulating product passing through the filter and thereby determining the correcting variable.

Intermodulation products are generated by the amplifier of the circuit arrangement. By virtue of the ensuing filter, certain intermodulation products can be filtered out and used to generate the correcting variable. It is preferred that intermodulation products are processed to which this is easily accomplished, for example intermodulation products having a frequency far from those of the useful signals.

When used in an amplifier, the full use of its dynamic range is possible if there is only one carrier frequency. The intermodulation products in the pass band of the main amplifier are kept below a preset value if there is more than one carrier frequency.

BRIEF DESCRIPTION OF THE DRAWINGS

Embodiments of the invention will be described in detail by way of the following drawings, in which.

DETAILED DESCRIPTION OF THE PREFERRED EMBODIMENTS

Figure 1:
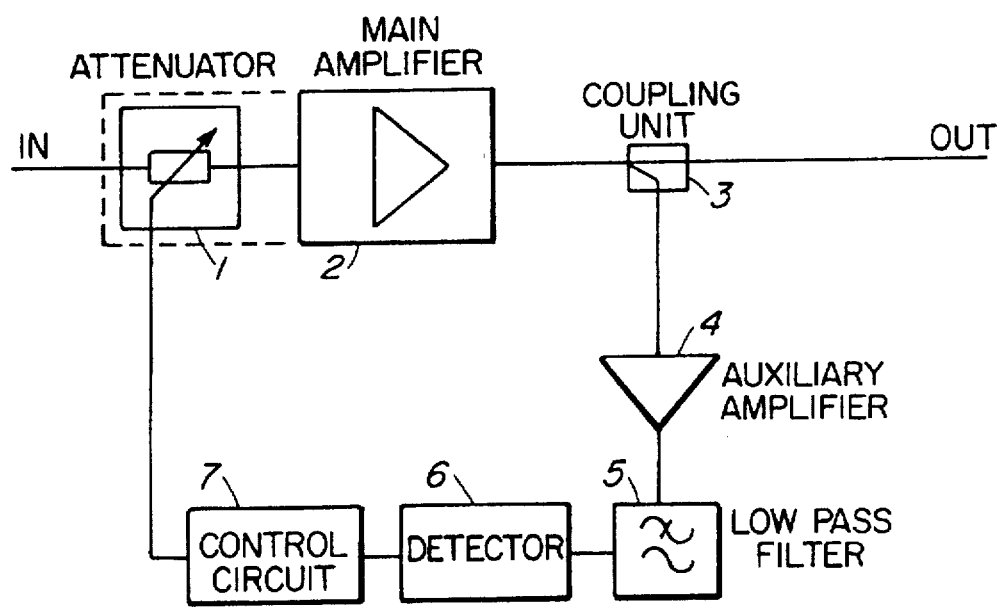
FIG. 1 is a first embodiment of the circuit arrangement used in an amplifier.

The amplifier of FIG. 1 comprises an attenuator 1 to which the input signals IN are applied. The output of the attenuator 1 is connected to the input of the main amplifier 2 which outputs the signals OUT. The output of the main amplifier 2 is connected via a coupling circuit 3 to the input of an amplifier according to the invention, termed auxiliary amplifier 4 as described below. The output of the auxiliary amplifier 4 is connected to a low-pass filter 5 the output of which is connected to a detector 6 e.g., in the form of a rectifier. The same is connected to a control circuit 7, e.g., a regulating amplifier the output of which controls the attenuator 1.

Figure 2:
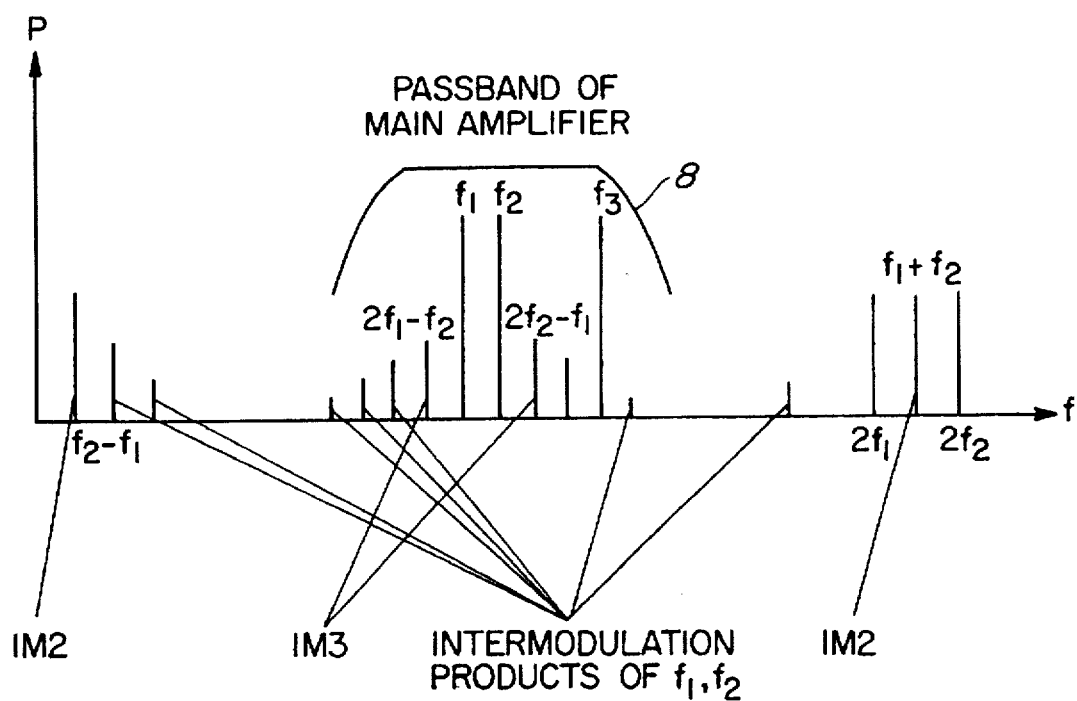
FIG. 2 is a frequency vs. amplitude diagram used to explain the functioning of the circuit arrangement and of the amplifier of FIG. 1.

FIG. 2 shows the pass band 8 of the main amplifier 2. In the case considered below it is assumed that two useful signals having the frequencies $f_1$ and $f_2$ are applied to the main amplifier via the attenuator 1. For example, there may be $f_1 = 935$ MHz and $f_2 = 960$ MHz. The amplified useful signal of the frequencies $f_1$ and $f_2$ appear also at the output of the main amplifier 2. In addition to these useful signals, at the output of the main amplifier there appear also intermodulation products, e.g., those of third order, IM3, having the frequencies $2f_1-f_2$ and $2f_2-f_1$. These intermodulation products IM3 fall into adjacent useful channels in the pass band 8 and are therefore undesired. Therefore, the amplitude of those intermodulation products must not exceed a predetermined amplitude.

The cited signals are applied to the input of the auxiliary amplifier 4 via the coupling circuit 3. This auxiliary amplifier 4 has a substantially broader pass band than the main amplifier 2. The useful signals of frequencies $f_1$ and $f_2$ which were amplified in it generate also intermodulation products of even order, e.g., of second order, IM2, having the frequencies $f_2-f_1$ and $f_1-f_2$. In this example, the intermodulation products IM2 of second order have a frequency of 25 MHz and of 1895 MHz. The low-pass filter 5 is designed to allow the passage of intermodulation products in the frequency range $f_2-f_1$ but blocks them in other frequency ranges. In this way the intermodulation product of the frequency $f_2-f_1$ passes to the detector 6 which is in the form of a rectifier and is rectified by it. The rectified signal is amplified in control circuit 7 and is applied as a correcting variable to the attenuator 1, whereby the attenuation of the useful signals of the frequencies $f_1$ and $f_2$ is changed in dependence upon this correcting variable. The higher the amplitude of the second-order intermodulation product IM2, the higher the degree of attenuation of the useful signals which are applied to the main amplifier 2. The useful signals, which are applied to the main amplifier 2 and, in amplified form, to the auxiliary amplifier 4, are attenuated to an extent such that the second order intermodulation products IM2 appearing at the output of the auxiliary amplifier are reduced. In this way the third-order intermodulation products IM3 which are generated by the main amplifier 2 are kept below a predetermined amplitude.

Figure 3:
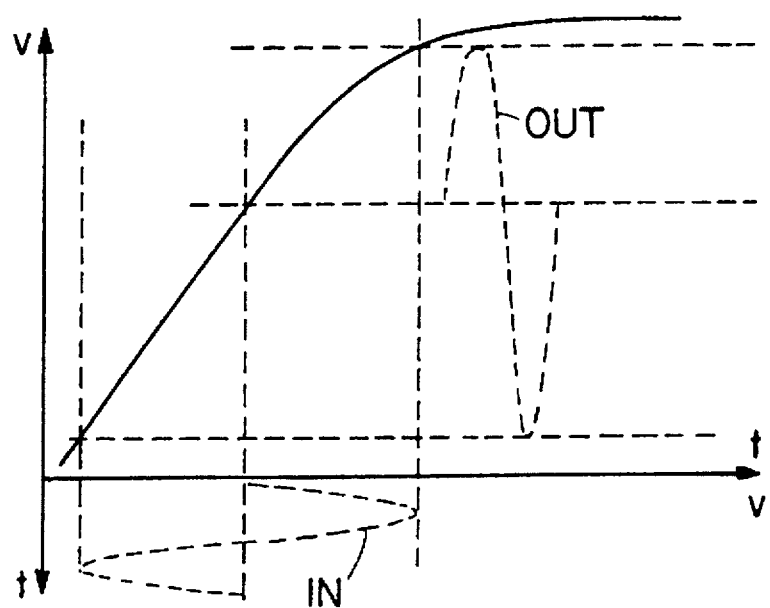
FIG. 3 is a gain characteristic of an amplifier with an input signal and output signal without attenuation.
Figure 4:
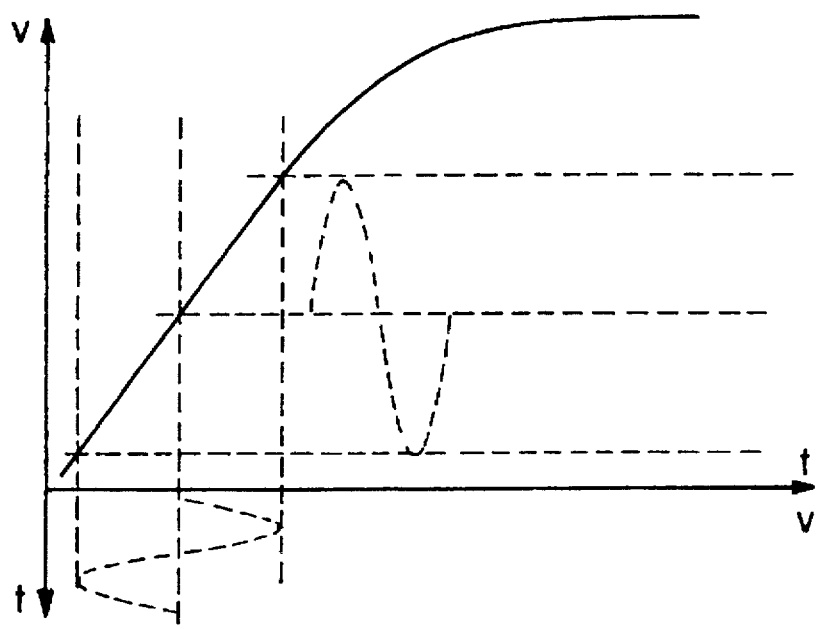
FIG. 4 is the same gain characteristic with an attenuated input signal.

FIG. 3 shows the gain characteristic of the main amplifier 2 together with the input signal IN and the output signal OUT. The amplifier works up to and into the nonlinear part of its characteristic and this causes generation of intermodulation products. In contrast, the amplifier works in the almost linear part of its characteristic in the case of the attenuated input signal as shown in FIG. 4, and the result is that the intermodulation products are much smaller.

Figure 5:
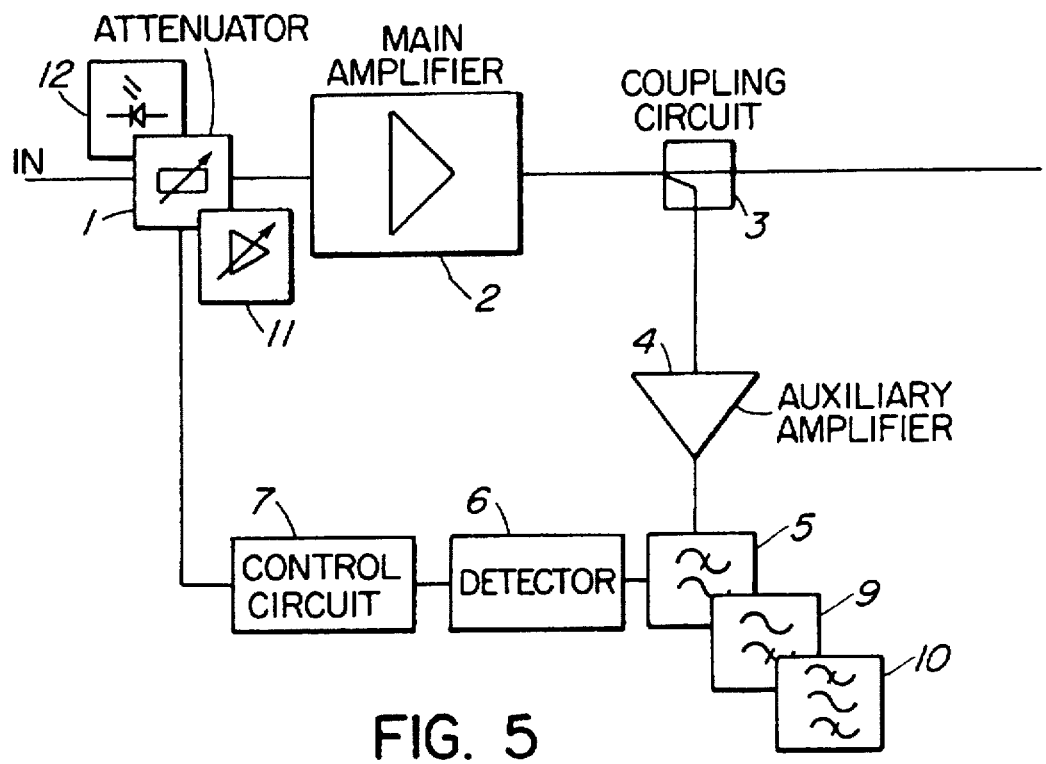
FIG. 5 is the amplifier according to the embodiment of FIG. 1 for explaining various embodiments.
Figure 6:
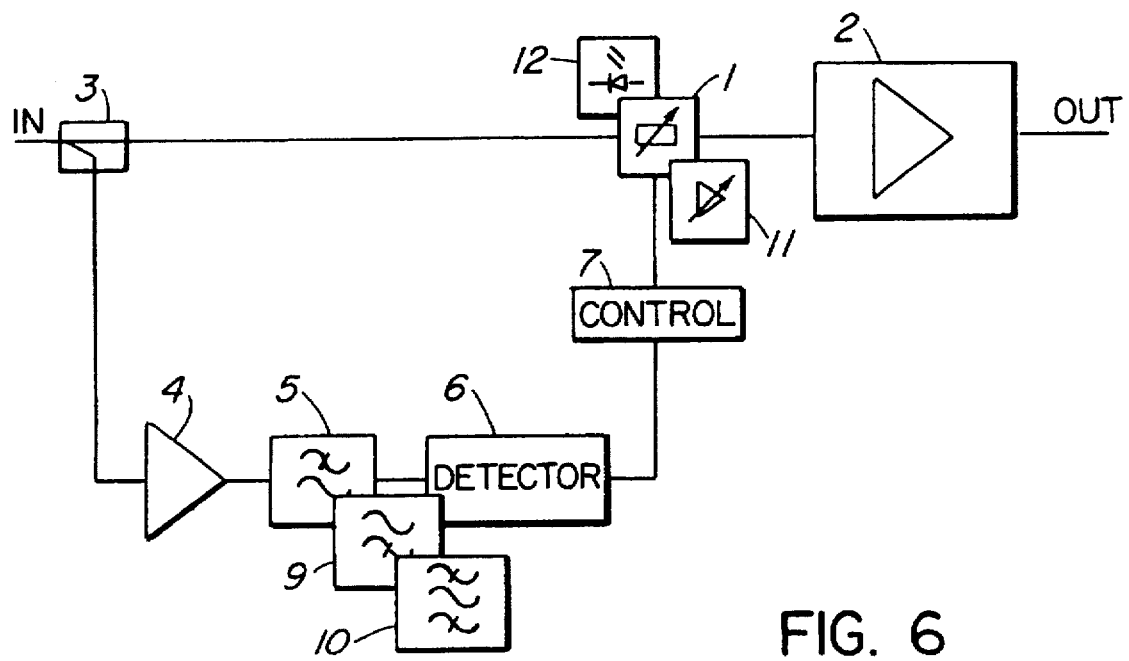
FIG. 6 is another embodiment of the circuit arrangement and of an amplifier with illustrations of modified embodiments.

If in place of the low-pass filter 5 a high-pass filter 9 or a band-pass filter 10 is used, the pass band of which is at the intermodulation product IM2 of the frequency $f_1+f_2$, the correcting variable is derived from this intermodulation product. This embodiment is illustrated in FIG. 5.

The correcting variable generated by the control circuit need not necessarily modify the attenuation of the attenuator 1. It is also possible to have the correcting variable change the gain of a preamplifier or the gain of the main amplifier 2 or of a stage of the main amplifier. This is shown in FIG. 5 by the block 11. The correcting variable may control an alarm 12, e.g., in the form of an LED, in place of the closed-loop regulating circuit of the above-described type, whereupon the attenuation or the gain may be changed manually, if necessary.

The useful signals of the frequencies $f_1$ and $f_2$ need not necessarily be applied to the auxiliary amplifier 4 from the output of the main amplifier 2. The useful signals IN which are applied to the auxiliary amplifier 4 can be input into the auxiliary amplifier 4 from the amplifier input via the coupling circuit 3. The auxiliary amplifier 4 has the same pass band as described with reference to FIG. 1. This auxiliary amplifier is followed by a low-pass filter 5 or a high-pass filter 9 or a band-pass filter 10 the output of which is connected with detector 6 which, in turn, is connected to the control circuit 7. The correcting variable generated by the control circuit 7 acts on a regulating element which modifies the attenuation or the gain as described above or controls an alarm 12.

If the main amplifier 2 is a multi-stage amplifier, the signal applied to the auxiliary amplifier 4 can be picked up from any stage of the main amplifier 2.

As set forth in the above description, the correcting variable controls an attenuator 1 or modifies the gain of a preamplifier preceding the main amplifier 2 or the gain of the main amplifier 2 or of one of its stages. But it is also possible that the correcting variable causes both an attenuation and a change of one of the above-listed gains. In addition, it is also possible to control an alarm 12.

Another embodiment resides on the fact that both a low-pass filter 5 and a high-pass filter 9 follow the auxiliary amplifier 4 and that, hence, the two interpolation products IM2 are processed for deriving the correcting variable.

I claim:

1. A circuit arrangement comprising:

a main amplifier having a first pass-band, input means for receiving input signals of simultaneous different frequencies and applying said input signals to an input of the main amplifier, output means for receiving output signals from an output of the main amplifier, means for attenuating signals passing between the input and output means, a control circuit for generating a correcting variable and for applying said correcting variable to said attenuating means, an auxiliary amplifier connected to receive signals derived from said input signals and having a second, substantially broader pass-band than the first pass-band and generating intermodulation products having frequencies outside the first pass-band, and a first filter connected to an output of said auxiliary amplifier, at least one of said intermodulation products having frequencies outside the first pass-band passing through said first filter for application to said control circuit to control a value of said correcting variable so as to cause signals to be amplified by the main amplifier in an approximately linear portion of a transfer characteristic of the main amplifier.

2. A circuit arrangement a defined in claim 1, in which said at least one intermodulation product generated by the auxiliary amplifier and passed by the filter are second order intermodulation products.

3. A circuit arrangement as defined in claim 2, in which the filter is a low-pass filter the pass band of which spans the difference frequency of a pair of input signals ($f_1$, $f_2$).

4. A circuit arrangement as defined in claim 2, in which the filter is at least one of a high-pass filter and a pass-band filter the pass band of which spans the sum frequency of a pair of input signals ($f_1$, $f_2$).

5. A circuit arrangement as defined in claim 1, further including a detector connected between the filter and the control circuit.

6. A circuit arrangement as defined in claim 5, in which the detector is a rectifier and the control circuit is comprised of another amplifier.

7. A circuit arrangement as defined in claim 1, in which the correcting variable is applied to the means for attenuating.

8. A circuit arrangement as defined in claim 1 further including an alarm, the correcting variable being applied to the alarm, the alarm being enabled if the correcting variable exceeds a predetermined value.

9. A circuit arrangement as defined in claim 7, wherein said attenuator means is connected in series with a signal input of the main amplifier, for attenuating the input signals.

10. A circuit arrangement as defined in claim 7, wherein said main amplifier is comprised of said attenuating means, and wherein the correcting variable is applied to said main amplifier, for modifying the gain of at least one amplifier stage contained between the main amplifier input and the main amplifier output.

11. A circuit arrangement as defined in claim 1, in which the input of the auxiliary amplifier is connected to the output of the main amplifier via a coupling circuit.

12. A circuit arrangement as defined in claim 1, in which the input of the auxiliary amplifier is connected to the input of the main amplifier via a coupling circuit.

13. A circuit arrangement as defined in claim 2, further including a detector connected between the filter and the control circuit.

14. A circuit arrangement as defined in claim 3, further including a detector connected between the filter and the control circuit.

15. A circuit arrangement as defined in claim 4, further including a detector connected between the filter and the control circuit.

16. A circuit arrangement as defined in claim 7, in which the input of the auxiliary amplifier is connected to the output of the main amplifier via a coupling circuit.

17. A circuit arrangement as defined in claim 7, in which the input of the auxiliary amplifier is connected to the input of the main amplifier via a coupling circuit.

* * * * *